US009466525B2

(12) United States Patent
Peng et al.

(10) Patent No.: US 9,466,525 B2
(45) Date of Patent: Oct. 11, 2016

(54) INTERCONNECT STRUCTURES COMPRISING FLEXIBLE BUFFER LAYERS

(71) Applicant: Taiwan Semiconductor Manufacturing Company, Ltd., Hsin-Chu (TW)

(72) Inventors: Chao-Hsien Peng, Zhubei (TW); Hsin-Yen Huang, Yonghe (TW); Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/685,217

(22) Filed: Apr. 13, 2015

(65) Prior Publication Data

US 2015/0214102 A1 Jul. 30, 2015

Related U.S. Application Data

(62) Division of application No. 13/624,766, filed on Sep. 21, 2012, now Pat. No. 9,030,013.

(51) Int. Cl.
| | |
|---|---|
| H01L 21/44 | (2006.01) |
| H01L 21/768 | (2006.01) |
| H01L 23/532 | (2006.01) |
| H01L 21/02 | (2006.01) |
| H01L 21/311 | (2006.01) |
| H01L 23/522 | (2006.01) |

(52) U.S. Cl.
CPC ... *H01L 21/76843* (2013.01); *H01L 21/02118* (2013.01); *H01L 21/311* (2013.01); *H01L 21/31144* (2013.01); *H01L 21/7684* (2013.01); *H01L 21/76802* (2013.01); *H01L 21/76831* (2013.01); *H01L 21/76834* (2013.01); *H01L 21/76877* (2013.01); *H01L 23/5226* (2013.01); *H01L 23/5329* (2013.01); *H01L 23/53238* (2013.01); *H01L 23/53295* (2013.01); *H01L 2924/0002* (2013.01)

(58) Field of Classification Search
CPC .................. H01L 21/76877; H01L 21/76805; H01L 21/76843; H01L 21/311; H01L 21/7684
USPC .................. 438/687, 622, 629, 672, 700; 257/E21.585
See application file for complete search history.

(56) References Cited

U.S. PATENT DOCUMENTS

| | | |
|---|---|---|
| 5,985,762 A | 11/1999 | Geffken et al. |
| 6,037,664 A | 3/2000 | Zhao et al. |
| 6,166,423 A | 12/2000 | Gambino et al. |
| 6,420,262 B1 * | 7/2002 | Farrar ............... H01L 21/32051 257/E21.577 |
| 6,426,249 B1 | 7/2002 | Geffken et al. |
| 6,433,429 B1 | 8/2002 | Stamper |
| 6,472,721 B2 | 10/2002 | Ma et al. |
| 6,693,356 B2 | 2/2004 | Jiang et al. |
| 7,163,883 B2 | 1/2007 | Agarwala et al. |
| 7,923,806 B2 | 4/2011 | Watanabe |
| 2002/0019123 A1 | 2/2002 | Ma et al. |
| 2003/0067077 A1 | 4/2003 | Lee |

(Continued)

*Primary Examiner* — Nitin Parekh
(74) *Attorney, Agent, or Firm* — Slater Matsil, LLP

(57) ABSTRACT

A structure includes a substrate, a low-k dielectric layer over the substrate, and a conductive barrier layer extending into the low-k dielectric layer. The conductive barrier layer includes a sidewall portion. A metal line in the low-k dielectric layer adjoins the conductive barrier layer. An organic buffer layer is between the sidewall portion of the conductive barrier layer and the low-k dielectric layer.

20 Claims, 4 Drawing Sheets

(56) References Cited

U.S. PATENT DOCUMENTS

| | | |
|---|---|---|
| 2005/0090094 A1 | 4/2005 | Oh et al. |
| 2005/0227479 A1 | 10/2005 | Feng et al. |
| 2007/0037385 A1 | 2/2007 | Huebinger et al. |
| 2007/0281091 A1 | 12/2007 | Kowalski et al. |
| 2009/0085173 A1 | 4/2009 | Boemmels et al. |
| 2009/0087992 A1* | 4/2009 | Srivastava ........ H01L 21/02063 438/701 |
| 2009/0197404 A1* | 8/2009 | Yang ................ H01L 21/02063 438/652 |
| 2009/0309226 A1* | 12/2009 | Horak .............. H01L 21/76805 257/762 |
| 2010/0327446 A1* | 12/2010 | Yang ................ H01L 21/76805 257/751 |

* cited by examiner

INTERCONNECT STRUCTURES COMPRISING FLEXIBLE BUFFER LAYERS

PRIORITY CLAIM

This application claims priority to U.S. application Ser. No. 13/624,766, filed on Sep. 21, 2012, entitled "Interconnect Structures Comprising Flexible Buffer Layers," which application is hereby incorporated herein by reference.

BACKGROUND

Integrated circuits include interconnect structures, which comprises metal lines and vias to serve as three-dimensional wiring structures. The purpose of the interconnect structures is to properly link densely packed devices together. With increasing levels of integration, the parasitic capacitance between the metal features of interconnect structures, which parasitic capacitance leads to RC delay and crosstalk of signals, increases correspondingly. In order to reduce the parasitic capacitance and increase the conduction speed between the metal interconnections, low-k dielectric materials are commonly employed to form Inter-Layer Dielectric (ILD) layers and Inter-Metal Dielectric (IMD) layers.

Copper has become the metal of choice over aluminum in the fabrication of integrated circuits. The reason is that copper has a lower resistance than aluminum, and hence allows for the scaling down of devices. Despite its advantages, the use of copper in interconnect structures poses several special problems that did not exist with the use of aluminum. One such problem is the occurrence of humps. Copper has a much higher Coefficient of thermal Expansion (CTE) than aluminum, so that it expands significantly when heated under typical temperatures used in semiconductor processing. Copper humps are the results of the expansion. Copper interconnect lines are typically formed by damascene processes, in which trench openings and via openings are formed in dielectric layers, and are then filled with copper. After a Chemical Mechanical Polish (CMP), the top surface of copper is leveled. In a subsequent formation of an etch stop layer that covers the copper, however, an elevated temperature is needed. When heated, copper is squeezed by the encircling materials, and hence expands upwardly to form humps, wherein the top surfaces of copper become higher than the top surface of the dielectric material in which the copper is located. The formation of the copper humps induces severe electro-migration of copper, and may result in the degradation in the performance of the resulting metal interconnect structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An interconnect structure and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 1:
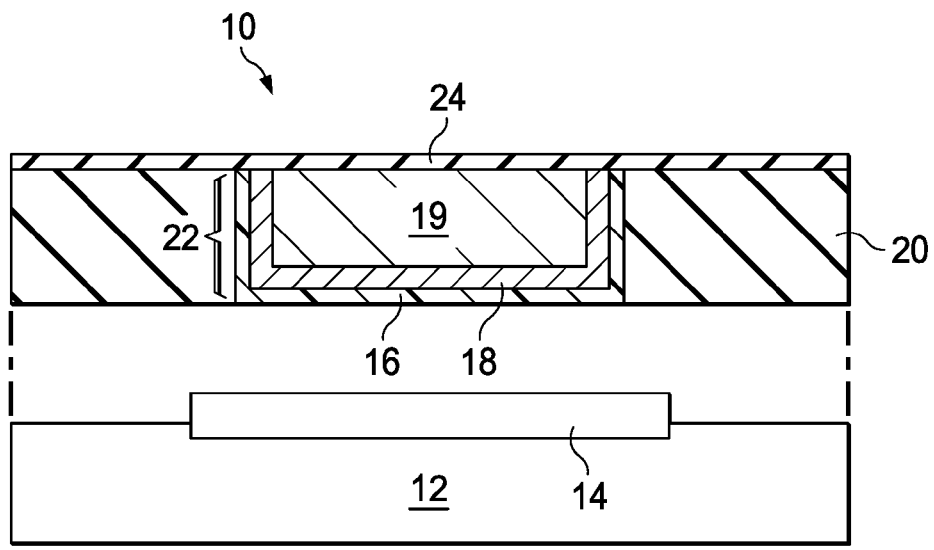
FIGS. 1 through 8 are cross-sectional views of intermediate stages in the manufacturing of an interconnect structure in accordance with some exemplary embodiments.

FIG. 1 illustrates wafer 10, which includes semiconductor substrate 12. In some embodiments, semiconductor substrate 12 is a bulk semiconductor substrate. In alternative embodiments, semiconductor substrate 12 is a Semiconductor-On-Insulator (SOI) substrate. The semiconductor material in semiconductor substrate 12 may comprise silicon, silicon germanium, silicon carbon, III-V compound semiconductor materials, and/or the like. In some embodiments, integrated circuits 14 are formed at a top surface of semiconductor substrate 12. Integrated circuits 14 may include active devices such as transistors.

Over integrated circuit 14 is dielectric layer 20, and barrier layer 18 and conductive line 22 formed in dielectric layer 20. Dielectric layer 20 may be an Inter-Layer Dielectric (ILD) layer or an Inter-Metal Dielectric (IMD) layer, and may have low dielectric constants (k values) lower than about 2.5, for example. Conductive line 22 may include conductive barrier layer 18 and metal line 19 over barrier layer 18. In some embodiments, barrier layer 18 comprises titanium, titanium nitride, tantalum, tantalum nitride, copper manganese, alloys thereof, and/or multi-layers thereof. Metal line 19 may comprise copper, tungsten, aluminum, nickel, and/or alloys thereof. Conductive line 22 may be electrically coupled to integrated circuits 14 and may serve as the interconnection between the devices in integrated circuits 14. In some embodiments, buffer layer 16 is formed between, and may be in contact with, barrier layer 18 and dielectric layer 20. Buffer layer 16 may be formed of a flexible material such as a polymer, which may comprise polyimide (PI), polyamide-imide (PAI), and/or the like. In alternative embodiments, buffer layer 16 is not formed.

Etch Stop Layer (ESL) 24 is formed over dielectric layer 20 and conductive line 22. ESL 24 may comprise a nitride, a silicon-carbon based material, a carbon-doped oxide, and/or combinations thereof. The formation methods include Plasma Enhanced Chemical Vapor Deposition (PECVD) or other methods such as High-Density Plasma CVD (HDP-CVD), Atomic Layer CVD (ALCVD), and the like. In alternative embodiments, dielectric layer 24 is a diffusion barrier layer that is used for preventing undesirable elements, such as copper, from diffusing into the subsequently formed low-k dielectric layer. In further embodiments, dielectric layer 24 acts as both an etch stop layer and a diffusion barrier layer.

Figure 2:
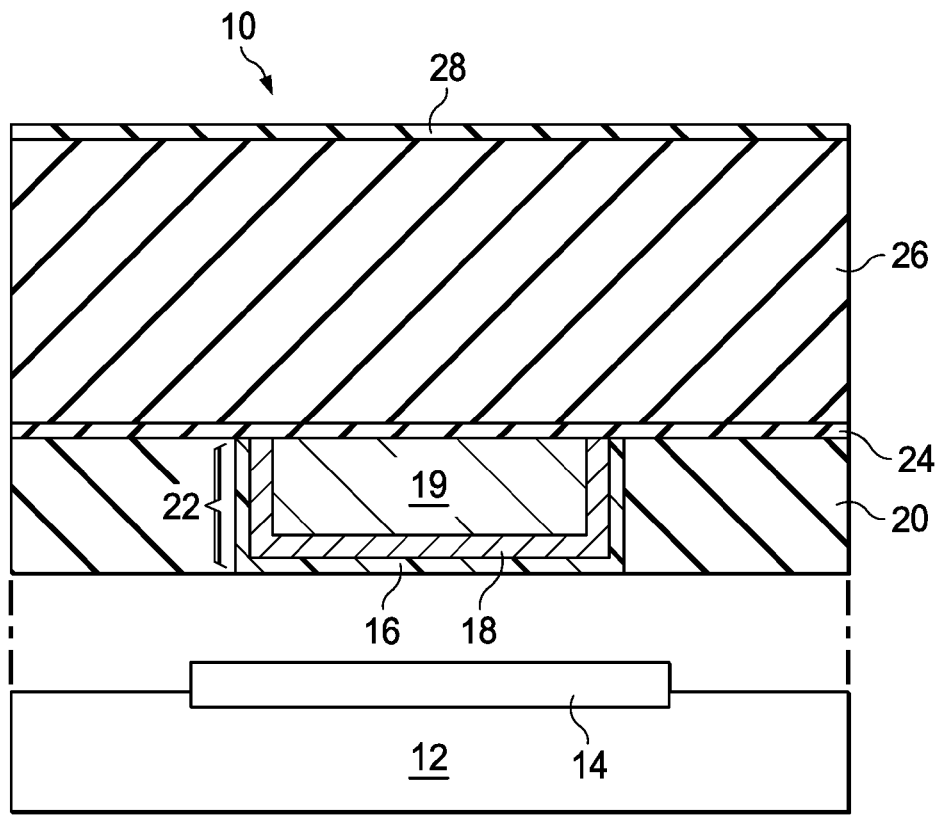

FIG. 2 illustrates the formation of low-k dielectric layer 26, which provides insulation between conductive line 22 and the overlying conductive lines that will be formed subsequently. Accordingly, low-k dielectric layer 26 is sometimes referred to as an Inter-Metal Dielectric (IMD) layer.

Low-k dielectric layer 26 may have a k value lower than about 3.5, or lower than about 2.5. The materials comprised in low-k dielectric layer 26 may include carbon-containing materials, organo-silicate glass, porogen-containing materials, and/or combinations thereof. Low-k dielectric layer 26 may be deposited using PECVD, although other commonly used deposition methods, such as Low Pressure CVD (LP-CVD), ALCVD, and spin-on, can also be used.

Hard mask layer 28 is formed over low-k dielectric layer 26. Hard mask layer 28 may be a dielectric layer. In some embodiments, hard mask layer 28 comprises silicon nitride, silicon carbide, or the like.

Figure 3:
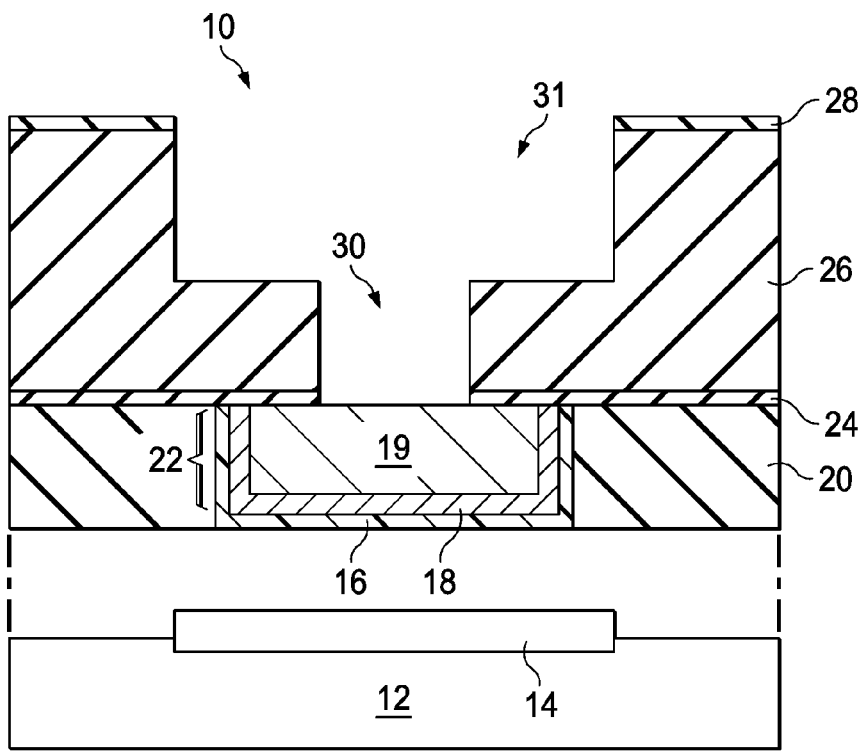

FIG. 3 illustrates the formation of via opening 30 and a trench opening 31 in low-k dielectric layer 26. Photo resists (not shown) are formed and patterned over low-k dielectric layer 26 to aid the formation of via opening 30 and trench opening 31. In some exemplary embodiments, an anisotropic etch is performed to cut through low-k dielectric layer 26, which anisotropic etch stops on ESL 24, thereby forming via opening 30. Trench opening 31 is then formed by etching low-k dielectric layer 26 using another patterned photo resist. Since there is no etch stop layer for stopping the etch step for forming trench opening 31, etching time is controlled so that the etch step for forming trench opening 31 stops at a desired depth. In alternative embodiments, a trench-first approach is taken, in which trench opening 31 is formed prior to the formation of via opening 30. ESL 24 is then etched through via opening 30, exposing underlying conductive line 22.

In alternative embodiments, the previously discussed low-k dielectric layer 26 is replaced by a first low-k dielectric layer (not shown), an ESL (not shown) on the first low-k dielectric layer, and a second low-k dielectric layer (not shown) on the ESL. One skilled in the art will realize the appropriate process steps.

Figure 4:
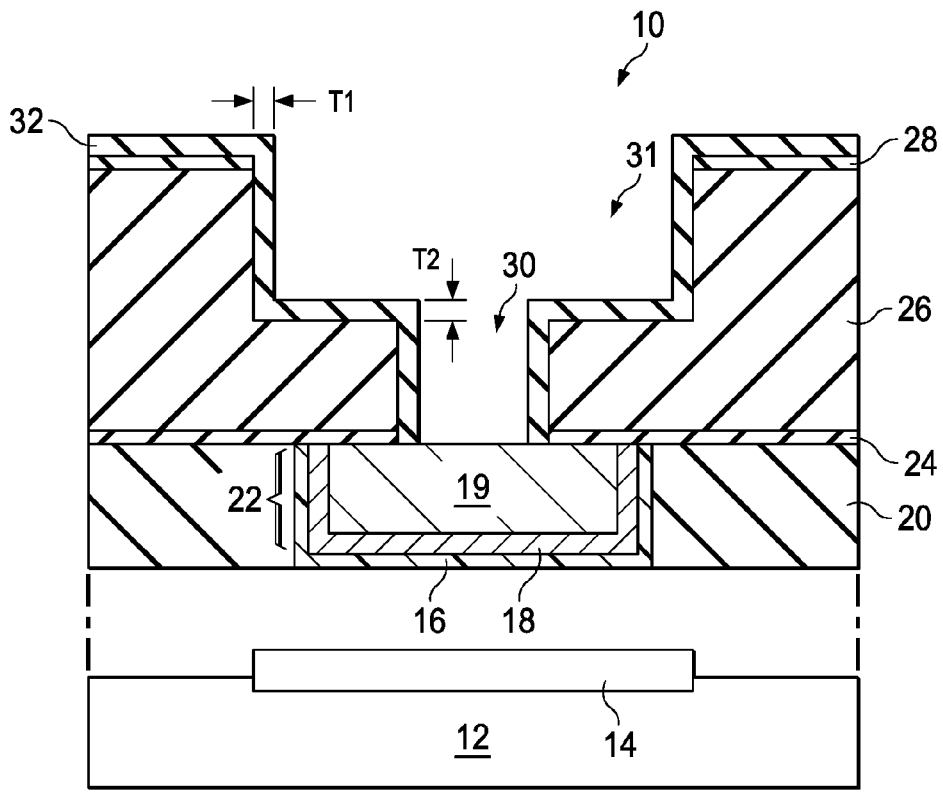

FIG. 4 illustrates the formation of buffer layer 32, which includes portions on the bottoms and sidewalls of openings 30 and 31, and portions over the top surface of hard mask layer 28. Buffer layer 32 may be an organic layer comprising an organic material. Furthermore, buffer layer 32 may be a dielectric layer. In some embodiments, buffer layer 32 comprises a polymer, although buffer layer 32 may also be a non-polymer layer. In some exemplary embodiments, buffer layer 32 comprises polyimide. In alternative embodiments, buffer layer 32 comprises polyimide, polyamide-imide, or the like. These materials have characteristics that are suitable for being used in the interconnect structure. For example, polyimide has a low k value (about 2.9), a low Coefficient of Thermal Expansion (CTE) (about 5 ppm/C.°), a high modulus (about 8.5 GPa), a high elongation ratio (about 25 percent), a high glass transition temperature (Tg) and a thermal decomposition temperature (higher than about 400° C.). With the low k value, the polyimide is beneficial for reducing the parasitic capacitance in the interconnect structure. With a low CTE and a high elongation ratio, buffer layer 32 may absorb the expanded volume generated by copper-containing material 36 (FIG. 8) in the subsequent heating process. With a high modulus, the resulting interconnect structure is mechanically strong. With a high glass transition temperature Tg and thermal decomposition temperature, buffer layer 32 is stable in the subsequent heating processes. Thicknesses T1 and T2 of buffer layer 32 may be between about 1 and about 10 μm, although different thicknesses may be used.

Figure 5:
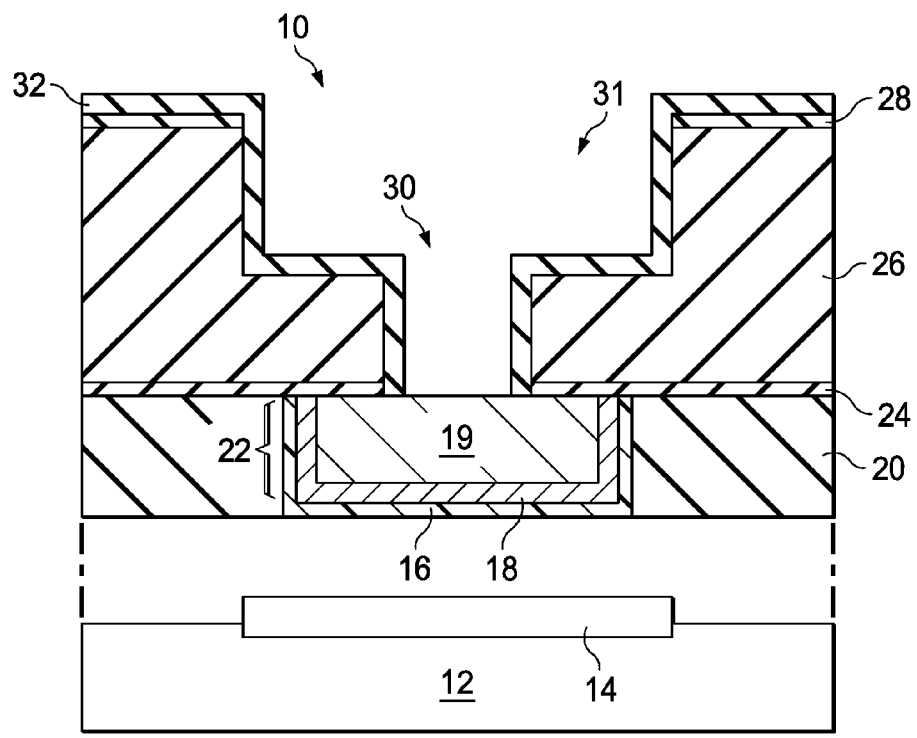

The formation of buffer layer 32 may comprise a coating process and a curing process. The coating process is controlled so that thickness T1 of the vertical portions of buffer layer 32 is close to thickness T2 of the horizontal portions of buffer layer 32. Accordingly, buffer layer 32 is substantially conformal, for example, with thickness T2 not greater than two times thickness T1. The curing may be a thermal curing or a Ultra-Violet (UV) curing. After the curing process, as shown In FIG. 5, a patterning step is performed, and the bottom portion of buffer layer 32 at the bottom of via opening 30 is removed to expose the underlying conductive line 22.

Figure 6:
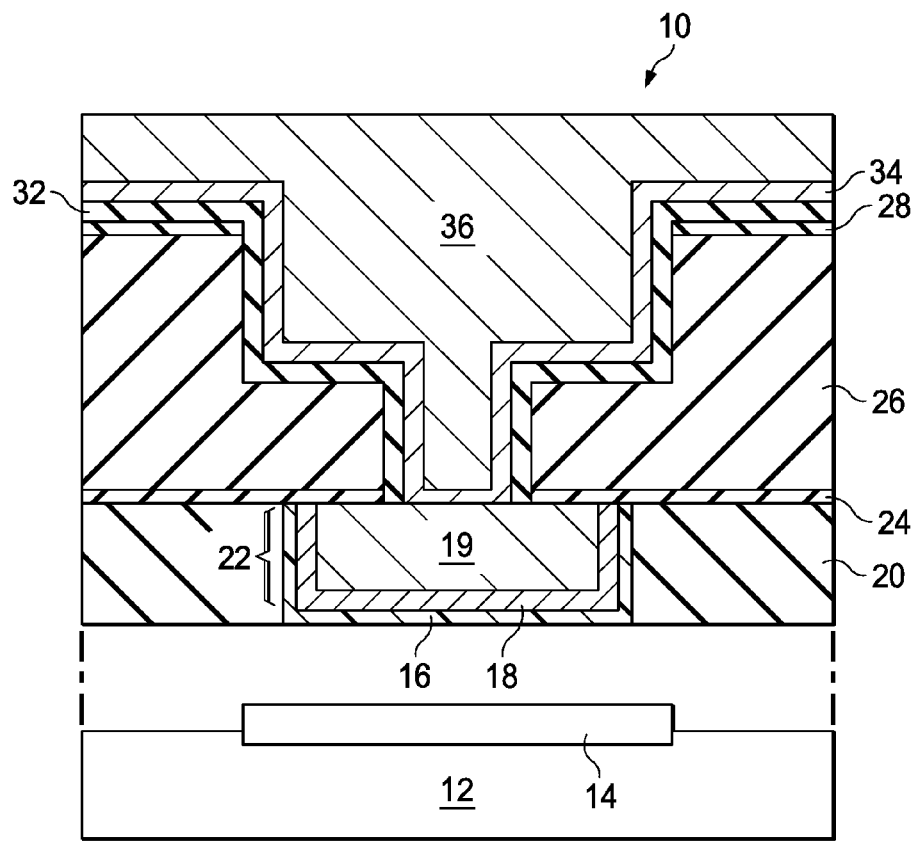

FIG. 6 illustrates the formation of conductive barrier layer 34 over buffer layer 32, and conductive material 36 over barrier layer 34. Conductive barrier layer 34 extends into openings 30 and 31 (FIG. 5), and includes a portion over buffer layer 32. Conductive barrier layer 34 also has a bottom portion contacting the top surface of conductive line 22. Barrier layer 34 may prevent the copper in conductive material 36 from diffusing into low-k dielectric layer 26. In some embodiments, conductive barrier layer 34 is formed of a conductive material comprising titanium, titanium nitride, tantalum, tantalum nitride, copper manganese, alloys thereof, or multi-layers thereof.

As also shown in FIG. 6, the remaining portions of via opening 30 and trench opening 31 (FIG. 5) that are not occupied by conductive barrier 34 are filled with conductive material 36, which may be a copper-containing material such as substantially pure copper or copper alloys. Other metals and metal alloys such as aluminum and tungsten may also be used or added into copper. The top surface of conductive material 36 is higher than the top surface of conductive barrier layer 34.

Figure 7:
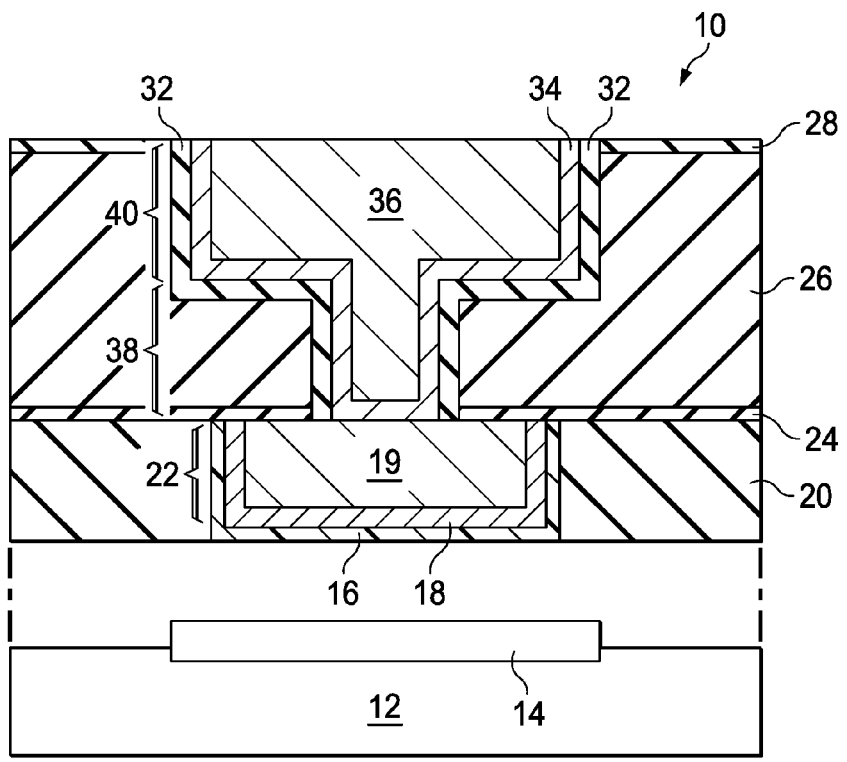

Referring to FIG. 7, a planarization such as Chemical Mechanical Polish (CMP) is then performed to remove excess conductive material 36, until the portions of conductive material 36 over the top surface of hard mask layer 28 are removed. Hard mask layer 28 may act as the polish stop layer in the planarization step. In the resulting structure, a dual damascene structure is formed, wherein the dual damascene structure includes via 38 and metal line 40. Each of via 38 and metal line 40 includes a respective portion of conductive material 36 and the corresponding underlying portions of barrier layer 34.

In the previously discussed embodiments, the formation of a dual damascene structure is illustrated. Similar process and materials as discussed in the embodiments can also be adopted in the formation of single damascene structures. For example, buffer layer 16 may comprise a same material, and may be formed using a method, as buffer layer 32. The process details may be realized referring to the discussion of buffer layer 32.

Figure 8:
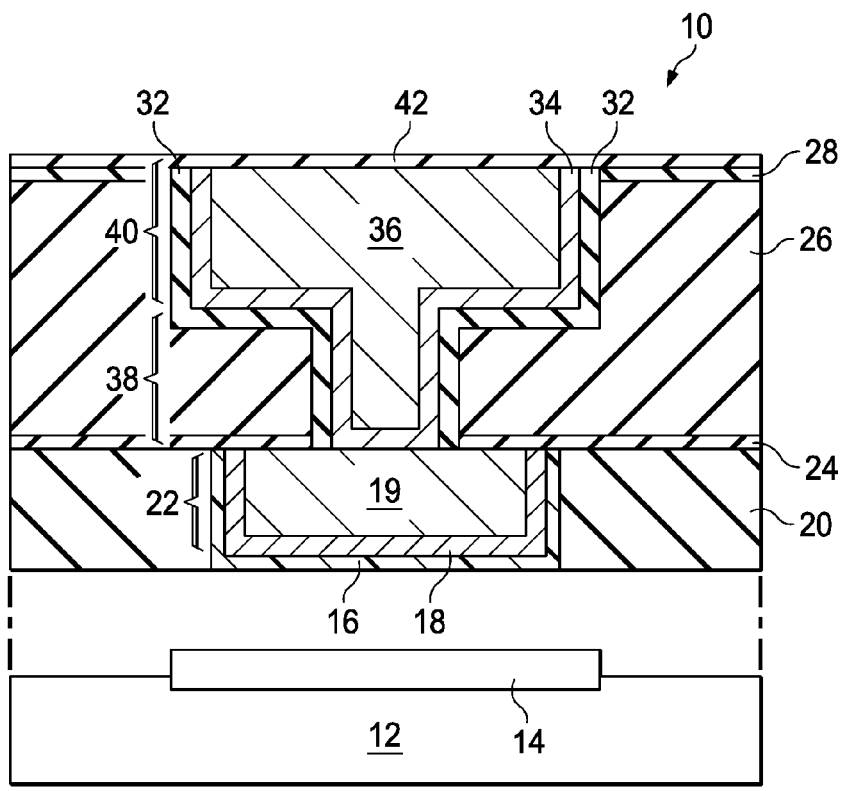

FIG. 8 illustrates the formation of ESL 42. In some embodiments, ESL 42 comprises a material selected from silicon nitride, silicon carbide, an oxide, an oxynitride, and the like. The formation may be performed through PECVD, for example. In the formation of ESL 42 and overlying structures, elevated temperatures may be used, which may range between about 200° C. and about 400° C. Since copper has a high CTE, it expands more than other surrounding materials such as low-k dielectric layer 26. Since buffer layer 32 is soft and has a high elongation ratio and a small CTE, it may yield space to via 38 and metal line 40 when via 38 and metal line 40 expand, so that via 38 and metal line 40 receive smaller squeezing force than when buffer layer 32 is not formed. With the smaller squeezing force, the hump of metal line 40, if any, will at least be smaller.

In accordance with embodiments, a structure includes a substrate, a low-k dielectric layer over the substrate, and a conductive barrier layer extending into the low-k dielectric layer. The conductive barrier layer includes a sidewall portion. A metal line in the low-k dielectric layer adjoins the conductive barrier layer. An organic buffer layer is between the sidewall portion of the conductive barrier layer and the low-k dielectric layer.

In accordance with other embodiments, a structure includes a semiconductor substrate, a low-k dielectric layer over the semiconductor substrate, and an opening extending from a top surface of the low-k dielectric layer into the low-k dielectric layer. A polymer layer is disposed in the opening, wherein the polymer layer includes a sidewall portion contacting a sidewall of the low-k dielectric layer. A conductive barrier layer is disposed in the low-k dielectric layer. A copper-containing metal feature is disposed in the low-k dielectric layer, wherein the conductive barrier layer is between and contacting the copper-containing metal feature and the polymer layer.

In accordance with yet other embodiments, a method includes forming an opening in a low-k dielectric layer, coating a polymer layer into the opening, and forming a conductive barrier layer over the polymer layer. The conductive barrier layer extends into the opening. A copper-containing metallic material is filled into a remaining portion of the opening. A planarization is performed to remove excess portions of the copper-containing metallic material, the conductive barrier layer, and the polymer layer, wherein the excess portions are outside the opening.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the present disclosure.

What is claimed is:

1. A method comprising:
   forming an opening in a low-k dielectric layer comprising a single layer continuously extending from a top of the opening to a portion at bottom of the opening, with the opening exposing an underlying conductive line;
   coating a polymer layer into the opening;
   patterning the polymer layer to expose a top surface of the underlying conductive line, wherein after the patterning, a horizontal portion of the polymer layer remains to contact a top surface of the low-k dielectric layer;
   forming a conductive barrier layer over the polymer layer, wherein the conductive barrier layer extends into the opening to contact the underlying conductive line;
   filling a conductive material into a remaining portion of the opening; and
   performing a planarization to remove excess portions of the conductive material, the conductive barrier layer, and the polymer layer, wherein the excess portions are outside of the opening.

2. The method of claim 1, wherein in the patterning, a portion of the polymer layer covering the underlying conductive line is removed.

3. The method of claim 1, wherein the conductive barrier layer comprises a horizontal portion overlapping the horizontal portion of the polymer layer.

4. The method of claim 1, wherein the coating the polymer layer into the opening comprises:
   coating a polyimide layer into the opening; and
   curing the polyimide layer, wherein the conductive barrier layer is formed over the cured polyimide layer.

5. The method of claim 1, wherein the forming the opening comprises:
   forming a trench opening; and
   forming a via opening underlying the trench opening, wherein the via opening and the trench opening are joined to form the opening.

6. The method of claim 1, wherein the conductive barrier layer comprises a conductive material selected from the group consisting of titanium, titanium nitride, tantalum, tantalum nitride, and combinations thereof.

7. The method of claim 1 further comprising, before the forming the opening, forming a dielectric hard mask over the low-k dielectric layer, wherein the forming the opening further comprises etching through the dielectric hard mask, and the polymer layer further comprises a portion over the dielectric hard mask, and after the planarization, the dielectric hard mask remains.

8. The method of claim 1, wherein the opening comprises a via opening and a trench over the via opening, and the horizontal portion is at a bottom of the trench.

9. A method comprising:
   forming a low-k dielectric layer over a first conductive line;
   forming a trench opening and a via opening in the low-k dielectric layer to reveal a top surface of the first conductive line, wherein the via opening is underlying the trench opening wherein the low-k dielectric layer comprises a low-k dielectric material continuously extending from a first level coplanar with a portion of the trench to a second level coplanar with a portion of the via opening, with the via opening exposing the first conductive line;
   coating an organic layer into the trench opening and the via opening, wherein the organic layer comprises a horizontal portion at a bottom of the trench, with the horizontal portion contacting a top surface of a dielectric material of the low-k dielectric layer;
   patterning the organic layer, wherein a first portion of the organic layer at a bottom of the via opening is removed to reveal the top surface of the first conductive line, and a second portion of the organic layer at a bottom of the trench opening remains after the patterning;
   forming a conductive barrier layer over the organic layer; and
   filling a conductive material into the trench opening and the via opening to form a second conductive line and a via, respectively.

10. The method of claim 9, wherein after the patterning, the organic layer has a bottom end contacting the top surface of the first conductive line.

11. The method of claim 9, wherein the organic layer comprises a polymer.

12. The method of claim 9, wherein the filling the conductive material comprises filling a copper-containing metallic material.

13. The method of claim 9 further comprising forming a dielectric hard mask layer over the low-k dielectric layer, wherein the filling the conductive material into the trench opening and the via opening comprises a planarization to remove excess portions of the conductive material over top surfaces of the low-k dielectric layer, the organic layer, and the conductive barrier layer, and the dielectric hard mask layer is used as a stop layer in the planarization.

14. The method of claim 9, wherein the low-k dielectric layer comprises a low-k dielectric material continuously extending from a first level coplanar with a portion of the trench to a second level coplanar with a portion of the via opening exposing the first conductive line.

15. A method comprising:
forming a low-k dielectric layer over a first conductive line;
forming a dielectric hard mask layer over the low-k dielectric layer;
forming a trench opening and a via opening in the low-k dielectric layer and the dielectric hard mask layer to reveal a top surface of the first conductive line, wherein the via opening is underlying the trench opening;
forming a polymer layer comprising a continuous portion comprising:
 a first portion on a sidewall of the trench opening;
 a second portion on a sidewall of the via opening; and
 a third portion connecting the first portion to the second portion;
forming a conductive barrier layer over the polymer layer, with a portion of the conductive barrier layer overlapping the third portion of the polymer layer;
filling a conductive material into the trench opening and the via opening to form a second conductive line and a via, respectively; and
performing a planarization to remove excess portions of the conductive material over top surfaces of the low-k dielectric layer, the conductive barrier layer, and the polymer layer, with the dielectric hard mask layer used as a stop layer in the planarization.

16. The method of claim 15, wherein the forming the polymer layer comprises:
coating a polymer layer into the trench opening and the via opening; and
patterning the polymer layer, with the continuous portion remains after the patterning.

17. The method of claim 16, wherein in the patterning the polymer layer, a portion of the polymer layer at a bottom of the via opening is removed to reveal the top surface of the first conductive line.

18. The method of claim 15, wherein a top surface of the third portion of the polymer layer is in contact with a bottom surface of the conductive barrier layer.

19. The method of claim 15, wherein the polymer layer is coated as a substantially conformal layer.

20. The method of claim 15, wherein the low-k dielectric layer comprises a low-k dielectric material continuously extending from a first level coplanar with a portion of the trench to a second level coplanar with a portion of the via opening exposing the first conductive line.

* * * * *